United States Patent
Takada et al.

(10) Patent No.: US 11,001,042 B2
(45) Date of Patent: May 11, 2021

(54) METHOD OF MANUFACTURING TREATED SHEET AND METHOD OF MANUFACTURING RESIN MULTILAYER SUBSTRATE

(71) Applicant: Murata Manufacturing Co., Ltd., Nagaokakyo (JP)

(72) Inventors: Ryosuke Takada, Nagaokakyo (JP); Hiroyuki Ohata, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 172 days.

(21) Appl. No.: 15/907,364

(22) Filed: Feb. 28, 2018

(65) Prior Publication Data

US 2018/0186138 A1 Jul. 5, 2018

Related U.S. Application Data

(63) Continuation of application No. PCT/JP2016/079484, filed on Oct. 4, 2016.

(30) Foreign Application Priority Data

Oct. 8, 2015 (JP) .............................. JP2015-200345

(51) Int. Cl.
*B32B 37/02* (2006.01)
*B32B 27/08* (2006.01)
(Continued)

(52) U.S. Cl.
CPC ................ *B32B 37/02* (2013.01); *B05D 3/06* (2013.01); *B29C 35/0805* (2013.01);
(Continued)

(58) Field of Classification Search
CPC ......... B32B 37/02; B32B 27/36; B32B 27/08; B32B 27/00; B32B 27/16; B29C 35/0805;
(Continued)

(56) References Cited

U.S. PATENT DOCUMENTS

2012/0255192 A1* 10/2012 Schroder ............... B29B 13/023
34/306
2014/0231123 A1* 8/2014 Onodera ................ H05K 1/032
174/255

(Continued)

FOREIGN PATENT DOCUMENTS

EP 0 556 790 A1 8/1993
JP 06-39967 A 2/1994
(Continued)

OTHER PUBLICATIONS

Polyethylene terephthalate) properties, http://www.polymerprocessing.com/polymers/PET.html (2001). (Year: 2001).*

(Continued)

*Primary Examiner* — Michael N Orlando
*Assistant Examiner* — Christopher W Raimund
(74) *Attorney, Agent, or Firm* — Keating & Bennett, LLP

(57) ABSTRACT

A method of manufacturing a treated sheet includes preparing a resin layer composite including a resin sheet and a thermoplastic resin layer supported on one surface of the resin sheet, applying a dispersion liquid including a powdery thermoplastic resin raw material onto a surface of the thermoplastic resin layer opposite to the resin sheet, and fusing the thermoplastic resin raw material to the thermoplastic resin layer by irradiating, with light from a flash lamp, a coating of the thermoplastic resin raw material formed in the applying step. The thermoplastic resin raw material has a melting point higher than the glass transition point of a resin that is a primary material of the resin sheet.

10 Claims, 9 Drawing Sheets

(51) Int. Cl.
*B32B 27/16* (2006.01)
*B32B 27/00* (2006.01)
*B05D 3/06* (2006.01)
*H05K 1/03* (2006.01)
*H05K 3/46* (2006.01)
*B29C 35/08* (2006.01)
*B32B 27/36* (2006.01)
*B05D 1/12* (2006.01)
*B05D 3/02* (2006.01)
*B05D 7/04* (2006.01)
*B05D 7/00* (2006.01)
*B29C 39/12* (2006.01)
*B29K 67/00* (2006.01)
*B29K 105/00* (2006.01)

(52) U.S. Cl.
CPC .............. *B32B 27/00* (2013.01); *B32B 27/08* (2013.01); *B32B 27/16* (2013.01); *B32B 27/36* (2013.01); *H05K 1/036* (2013.01); *H05K 3/4673* (2013.01); *B05D 1/12* (2013.01); *B05D 3/0254* (2013.01); *B05D 7/04* (2013.01); *B05D 7/542* (2013.01); *B05D 2401/00* (2013.01); *B29C 39/123* (2013.01); *B29C 2035/0827* (2013.01); *B29K 2067/003* (2013.01); *B29K 2105/0079* (2013.01); *H05K 2203/0278* (2013.01); *H05K 2203/1355* (2013.01)

(58) Field of Classification Search
CPC .......... B29C 39/123; B29C 2035/0827; B29K 2067/003; B29K 2105/0079; H05K 2203/0278; H05K 2203/1355; H05K 1/036; H05K 3/4673; B05D 7/04; B05D 7/542; B05D 3/0254; B05D 2401/00; B05D 1/12; B05D 3/06
See application file for complete search history.

(56) References Cited

U.S. PATENT DOCUMENTS

| | | | |
|---|---|---|---|
| 2015/0113802 A1* | 4/2015 | Kotsubo | H05K 3/005 |
| | | | 29/850 |
| 2015/0294754 A1* | 10/2015 | Ohata | H05K 3/4632 |
| | | | 428/195.1 |
| 2015/0299405 A1 | 10/2015 | Ohata | |
| 2015/0305150 A1 | 10/2015 | Ohata | |

FOREIGN PATENT DOCUMENTS

| | | |
|---|---|---|
| JP | 2012-166140 A | 9/2012 |
| WO | 2014/109139 A1 | 7/2014 |
| WO | 2014/109199 A1 | 7/2014 |
| WO | 2014/188830 A1 | 11/2014 |
| WO | 2016/143523 A1 | 9/2016 |

OTHER PUBLICATIONS

Official Communication issued in International Patent Application No. PCT/JP2016/079484, dated Jan. 10, 2017.

* cited by examiner

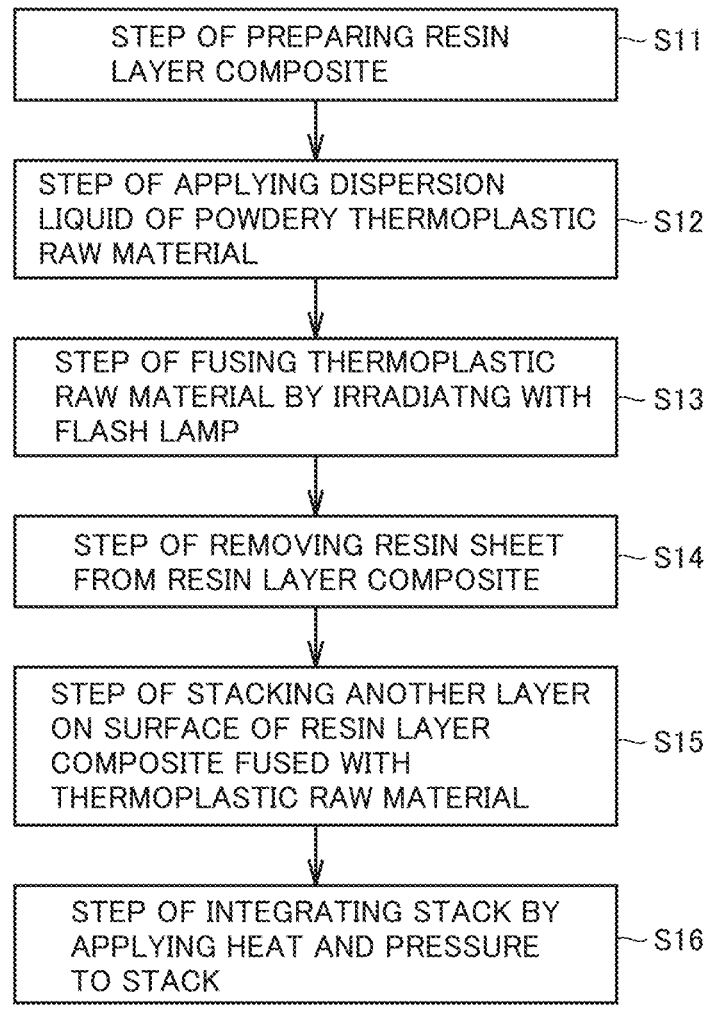
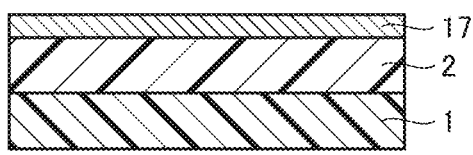

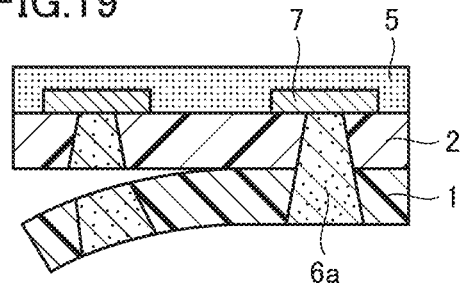
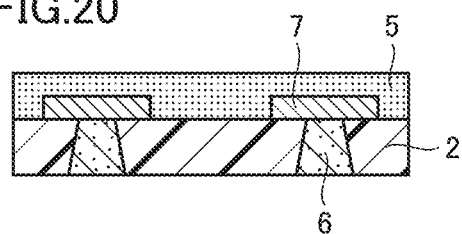
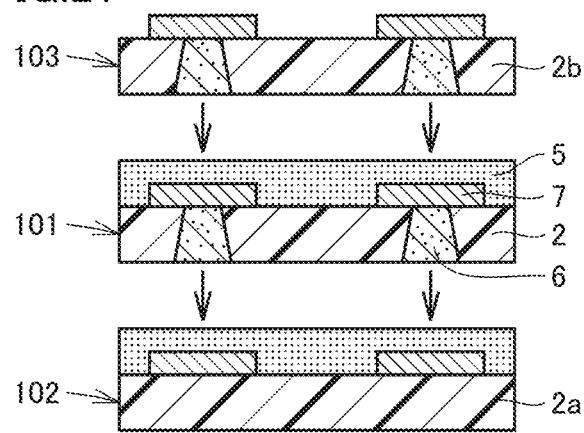

METHOD OF MANUFACTURING TREATED SHEET AND METHOD OF MANUFACTURING RESIN MULTILAYER SUBSTRATE

CROSS REFERENCE TO RELATED APPLICATIONS

This application claims the benefit of priority to Japanese Patent Application No. 2015-200345 filed on Oct. 8, 2015 and is a Continuation Application of PCT Application No. PCT/JP2016/079484 filed on Oct. 4, 2016. The entire contents of each application are hereby incorporated herein by reference.

BACKGROUND OF THE INVENTION

1. Field of the Invention

The present invention relates to a method of manufacturing a treated sheet and a method of manufacturing a resin multilayer substrate.

2. Description of the Related Art

As described in WO2014/109139, an integrated resin multilayer substrate is obtained by stacking and thermocompression bonding of a plurality of resin layers, each of which is made primarily of thermoplastic resin and includes a main surface. WO2014/109139 describes a configuration of such a resin multilayer substrate. In this configuration, when the plurality of resin layers include a resin layer including a pattern material disposed on its main surface, a coating layer is formed on a surface of a resin layer of at least any one of the plurality of resin layers by applying a powdery thermoplastic resin coating material onto a region corresponding to a region having an insufficient thickness in the overall stack during stacking and thermocompression bonding of the plurality of resin layers.

In the formation of a coating material layer by applying a powdery thermoplastic resin coating material, the coating material is applied and is subsequently dried. However, a powdery thermoplastic resin coating material may be dispersed after drying. Dispersion of the powdery thermoplastic resin coating material may reduce the degree of cleanness of plant facilities. Any dispersed powder that has landed in an undesirable place may lead to a defective product as foreign matter.

Although fusing powders together by a high-temperature heat treatment is an effective way to prevent dispersion of a powdery thermoplastic resin, a resin sheet may deform during heating if the resin sheet has a glass transition point lower than the melting point of the powder.

SUMMARY OF THE INVENTION

Preferred embodiments of the present invention provide methods of manufacturing a treated sheet and methods of manufacturing a resin multilayer substrate that are able to compensate for a thickness of an entire stack without dispersion of powdery matter and deformation of a resin sheet.

A method of manufacturing a treated sheet according to a preferred embodiment of the present invention includes preparing a resin layer composite including a resin sheet and a thermoplastic resin layer supported on one surface of the resin sheet, applying a dispersion liquid including a powdery thermoplastic resin raw material onto a surface of the thermoplastic resin layer opposite to the resin sheet, and fusing the thermoplastic resin raw material to the thermoplastic resin layer by irradiating, with light from a flash lamp, a coating of the thermoplastic resin raw material formed in the applying step. The thermoplastic resin raw material has a melting point higher than the glass transition point of a resin that is a primary material of the resin sheet.

According to a preferred embodiment of the present invention, the step of fusing the thermoplastic resin raw material using the light from the flash lamp is performed after the step of applying the dispersion liquid of the powdery thermoplastic resin raw material, thus, increasing the adhesion strength of the thermoplastic resin raw material to the thermoplastic resin layer. The thickness of the entire stack is thus able to be compensated without dispersion of powdery matter. Since heating performed with the light from the flash lamp in the fusing step only includes heating of the outermost surface in a short period of time, an increase in the temperature of the resin sheet is able to be reduced or prevented. Consequently, the temperature of the resin sheet is not higher than or equal to the glass transition point, which causes no deformation of the resin sheet.

The above and other elements, features, steps, characteristics and advantages of the present invention will become more apparent from the following detailed description of the preferred embodiments with reference to the attached drawings.

BRIEF DESCRIPTION OF DRAWINGS

FIG. 10 is a flowchart of a method of manufacturing a resin multilayer substrate according to Preferred Embodiment 3 of the present invention.

FIG. 11 illustrates a first step of the method of manufacturing a resin multilayer substrate according to Preferred Embodiment 3 of the present invention.

FIG. 19 illustrates a ninth step of the method of manufacturing a resin multilayer substrate according to Preferred Embodiment 3 of the present invention.

FIG. 20 illustrates a tenth step of the method of manufacturing a resin multilayer substrate according to Preferred Embodiment 3 of the present invention.

FIG. 21 illustrates an eleventh step of the method of manufacturing a resin multilayer substrate according to Preferred Embodiment 3 of the present invention.

DETAILED DESCRIPTION OF THE PREFERRED EMBODIMENTS

The dimensional ratio shown in each of the figures does not always faithfully show the actual dimensional ratio, and may show the dimensional ratio in an exaggerated manner for the sake of explanation. In the following description, mentioning of the concept "upper" or "lower" does not indicate an absolutely upper or lower position, but indicates a relative upper or lower position in the positions shown in each figure.

Preferred Embodiment 1

Figure 1:
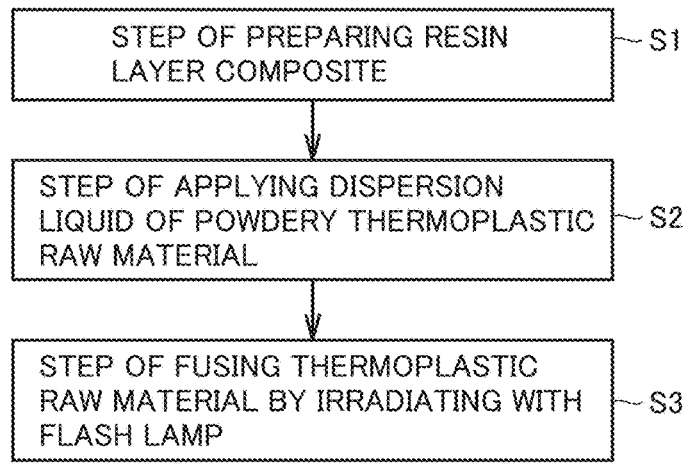
FIG. 1 is a flowchart of a method of manufacturing a treated sheet according to Preferred Embodiment 1 of the present invention.

With reference to FIGS. 1 to 5, a method of manufacturing a treated sheet according to Preferred Embodiment 1 of the present invention will be described. FIG. 1 shows a flowchart of the method of manufacturing a treated sheet according to the present preferred embodiment.

The method of manufacturing a treated sheet according to the present preferred embodiment includes a step S1 of preparing a resin layer composite including a resin sheet and a thermoplastic resin layer supported on one surface of the resin sheet, a step S2 of applying a dispersion liquid including a powdery thermoplastic resin raw material onto a surface of the thermoplastic resin layer opposite to the resin sheet, and a step S3 of fusing the thermoplastic resin raw material to the thermoplastic resin layer by irradiating, with light from a flash lamp, a coating of the thermoplastic resin raw material which has been formed in the applying step. The thermoplastic resin raw material preferably has a melting point higher than the glass transition point of a resin that is a main material of the resin sheet.

Figure 2:
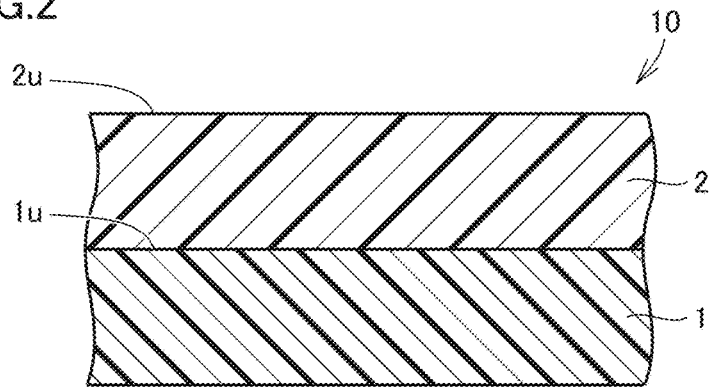
FIG. 2 illustrates a first step of the method of manufacturing a treated sheet according to Preferred Embodiment 1 of the present invention.

Each step of the method of manufacturing a treated sheet according to the present preferred embodiment will now be described in more detail. In step S1, a resin layer composite 10 is prepared. As shown in FIG. 2, resin layer composite 10 includes a resin sheet 1 and a thermoplastic resin layer 2 supported on a surface 1u that is one surface of resin sheet 1. Resin sheet 1 is preferably made of, for example, polyethylene terephthalate (PET) and has a glass transition point lower than the melting point of a thermoplastic resin raw material (e.g., liquid crystal polymer). Resin sheet 1 is structured and arranged to enable, for example, increased handleability in various processes to be performed on thermoplastic resin layer 2. When a plurality of resin layers including a treated sheet are stacked to produce a multilayer substrate, resin sheet 1 also is structured and arranged to sufficiently fill the via holes of thermoplastic resin layer 2 with a conductive paste of an interlayer connection conductor.

Figure 3:
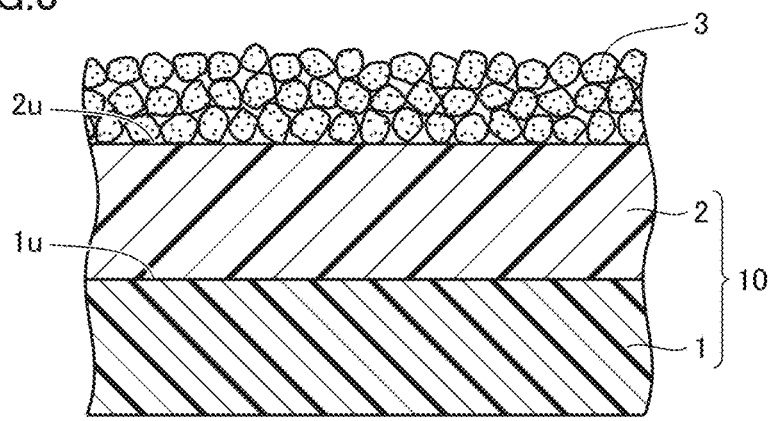
FIG. 3 illustrates a second step of the method of manufacturing a treated sheet according to Preferred Embodiment 1 of the present invention.
Figure 4:
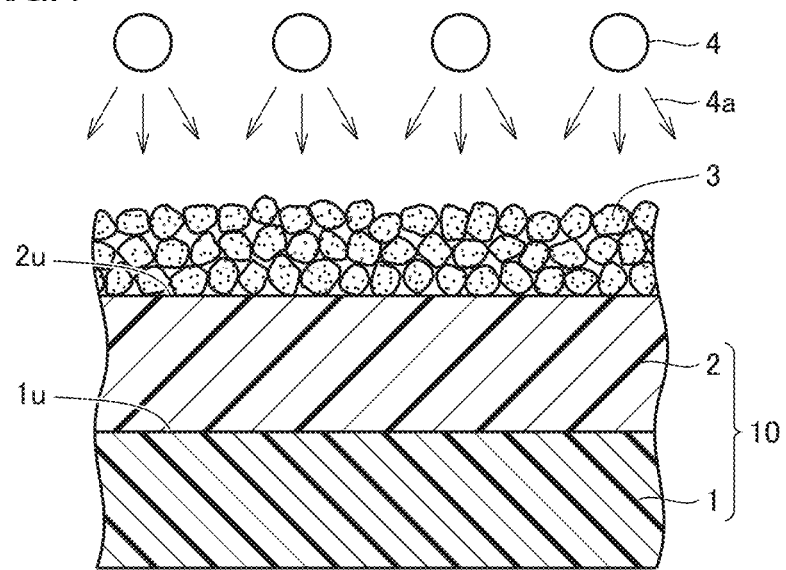
FIG. 4 illustrates a third step of the method of manufacturing a treated sheet according to Preferred Embodiment 1 of the present invention.

In step S2, as shown in FIG. 3, a dispersion liquid including a powdery thermoplastic resin raw material 3 is applied onto a surface 2u of thermoplastic resin layer 2 opposite to resin sheet 1. The dispersion liquid may preferably be dried after application, for example. In step S3, as shown in FIG. 4, thermoplastic resin raw material 3 is fused to thermoplastic resin layer 2 by irradiating, with light 4a from a flash lamp 4, a coating of thermoplastic resin raw material 3 which has been formed in the applying step S2. Irradiation with flash lamp 4 is preferably performed for a very short period of time. In other words, light 4a is preferably applied in a pulsed manner.

Figure 5:
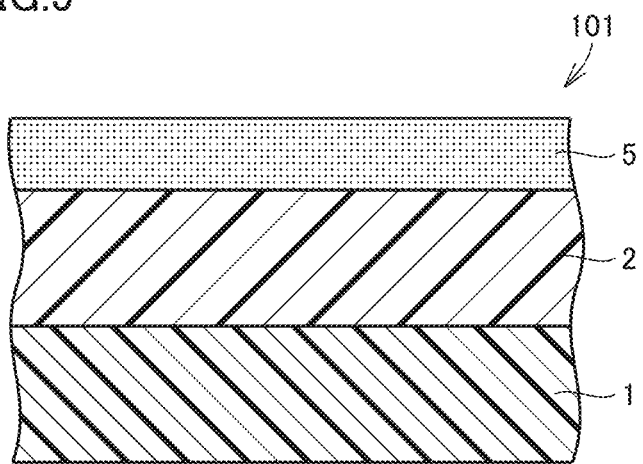
FIG. 5 illustrates a fourth step of the method of manufacturing a treated sheet according to Preferred Embodiment 1 of the present invention.

After the completion of step S3, the coating of thermoplastic resin raw material 3 has been fused, and as shown in FIG. 5, a thermoplastic fused layer 5 is formed on thermoplastic resin layer 2. Thermoplastic fused layer 5 is the coating of thermoplastic resin raw material 3 that has melted and then hardened. Powdery thermoplastic resin raw material 3 is deposited on thermoplastic resin layer 2 in FIG. 4, whereas thermoplastic fused layer 5 shown in FIG. 5 is a substantially integrated layer and is fixed to thermoplastic resin layer 2 by fusing.

In the present preferred embodiment, step S3 of fusing thermoplastic resin raw material 3 to thermoplastic resin layer 2 is performed by irradiating, with light 4a from flash lamp 4, the coating of thermoplastic resin raw material 3, thus increasing the adhesion strength of the thermoplastic resin raw material to thermoplastic resin layer 2. Since the thermoplastic resin raw material is fused to thermoplastic resin layer 2 to be integrated therewith, a powder that is a thermoplastic resin raw material is prevented from peeling off or dispersing. A coating of thermoplastic resin raw material 3 which has been obtained by fusing in step S3 after the formation of step S2 is able to compensate for a level difference caused by a difference in thickness. In other words, the coating defines a level difference compensating layer. The present preferred embodiment therefore compensates for the thickness of the entire stack without dispersion of powdery matter.

When the temperature at which the coating of the thermoplastic resin raw material fuses is higher than or equal to the temperature at which resin sheet 1 supporting thermoplastic resin layer 2 deforms, heating using any other heating mechanism, that is, a hot plate, IR heating, or a heating furnace, for example, increases uniformly the temperature of resin layer composite 10 in its entirety. This causes resin sheet 1 to reach the glass transition point and deform before the coating of the thermoplastic resin raw material fuses. However, the use of a flash lamp enables irradiation with high energy in a period of time as short as several milliseconds or less, for example, thus increasing the temperature of only the front layer of thermoplastic resin raw material 3 having a depth of several μm or less, for example, close to the front surface without increasing the temperature of the entire resin layer composite 10. In other words, the temperature of the coating alone is able to be increased. Thus, the coating is able to be fused to thermoplastic resin layer 2 without deformation of resin sheet 1. Unless resin layer composite 10 is increased in temperature so as to deform entirely, it is permissible that a portion of thermoplastic resin layer 2 close to its upper surface, that is, a "front layer portion" will increase in temperature and partially melt.

The primary material of the thermoplastic resin raw material is preferably identical or substantially identical to the primary material of the thermoplastic resin layer. This is because the use of the same primary material enables the thermoplastic resin raw material to securely bond to the thermoplastic resin layer when the former is fused to the latter.

The primary material of the thermoplastic resin raw material is preferably a liquid crystal polymer (hereinafter also simply as an "LCP"), for example. This is because in this case, crushing a sheet of the liquid crystal polymer easily obtains a powdery thermoplastic resin raw material.

The powdery thermoplastic resin raw material is preferably a fibrillated powder, for example, because in this case, the surface area of the powder increases, which enables excellent fusing. WO2014/188830 describes fibrillated particles in detail. In particular, the powdery thermoplastic resin raw material is preferably a fibrillated LCP powder, for example.

Figure 6:
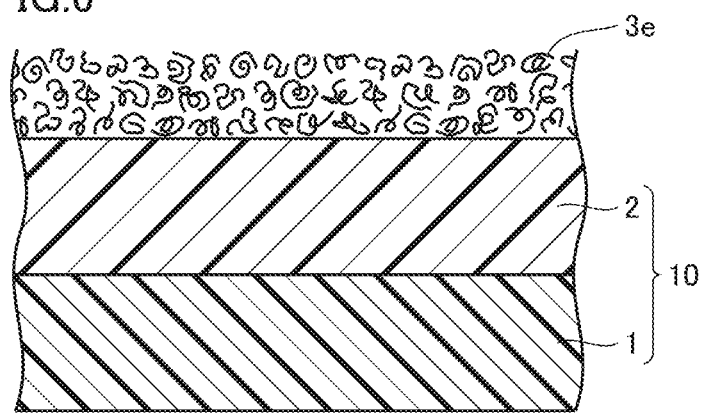
FIG. 6 is a sectional view showing a state in which a dispersion liquid of a thermoplastic resin raw material has been applied and dried, where the powdery thermoplastic resin raw material is a fibrillated powder in Preferred Embodiment 1 of the present invention.
Figure 7:
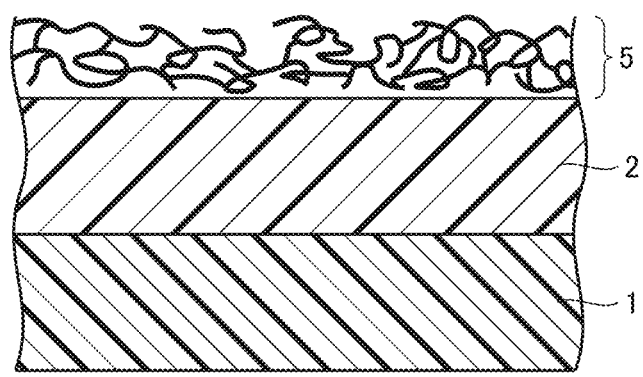
FIG. 7 is a sectional view showing a state in which a powdery thermoplastic resin raw material has been fused, where the thermoplastic resin raw material is a fibrillated powder in Preferred Embodiment 1 of the present invention.

When the powdery thermoplastic resin raw material is fibrillated powder (hereinafter, as "fibrillated powder"), the state as shown in FIG. 6 is achieved after the completion of step S2 and drying. In FIG. 6, fibrillated powder 3e adheres to the upper surface of thermoplastic resin layer 2 as a coating. The state shown in FIG. 7 is achieved after the completion of step S3. Fibrillated powder 3e in FIG. 6 has been fused and integrated to turn into a thermoplastic fused layer 5 in FIG. 7. FIGS. 6 and 7 schematically show the states of the thermoplastic resin raw material before and after fusing, respectively.

Figure 8:
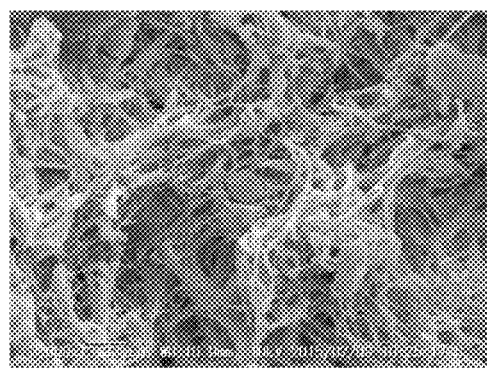
FIG. 8 is a SEM picture showing a state in which a dispersion liquid of a powdery thermoplastic resin raw material has been applied and dried, where the thermoplastic resin raw material is a fibrillated powder in Preferred Embodiment 1 of the present invention.
Figure 9:
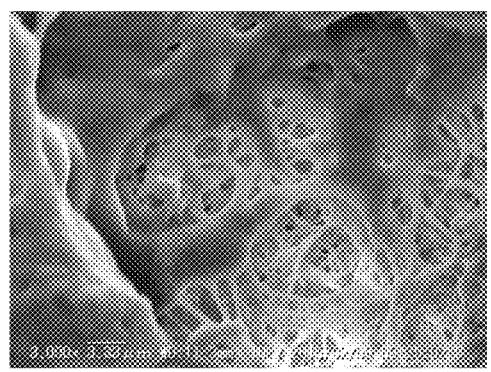
FIG. 9 is a SEM picture showing a state in which a powdery thermoplastic resin raw material has been fused, where the thermoplastic resin raw material is a fibrillated powder in Preferred Embodiment 1 of the present invention.

FIG. 8 shows a picture of a surface of the coating of fibrillated powder 3e corresponding to the state of FIG. 6 which has been taken under a scanning electron microscope (SEM) in the case in which the thermoplastic resin raw material is primarily made of liquid crystal polymer. In addition, FIG. 9 shows a picture of the coating after step S3 which has been taken under the SEM. FIG. 9 shows the surface of thermoplastic fused layer 5. Although FIG. 8 shows a large number of fine fibrous portions, FIG. 9 shows a reduced number of fine portions and shows coarse, thick fibrous portions. With reference to FIG. 9, the thermoplastic resin raw material is fused to the thermoplastic resin layer.

Preferred Embodiment 2

A method of manufacturing a treated sheet according to Preferred Embodiment 2 of the present invention will be described. Although the method of manufacturing a treated sheet according to the present preferred embodiment is substantially similar to the method described in Preferred Embodiment 1, specific examples will now be described more specifically.

An LCP powder, for example, is preferably used as "powdery thermoplastic resin raw material" in the present preferred embodiment. A biaxially oriented film of LCP having a thickness of about 125 μm was used as a raw material for this LCP powder, for example. The biaxially oriented film of LCP was primarily crushed using a rotary cutter mill. In the primary crushing, only LCP that was crushed to such a size as to pass through a 3-mm-diameter sieve was collected. The film after the primary crushing was secondarily crushed using a freezing and crushing machine, resulting in an LCP powder.

Subsequently, the LCP powder sieved through a 150-μm mesh was used and fibrillated in a high-pressure wet crushing apparatus. An approximately 20% aqueous ethanol solution was used as a dispersion medium, and the LCP powder was added at a weight ratio of about 5%. The obtained dispersion liquid was further diluted with an approximately 20% aqueous ethanol solution to have a solid content with a weight ratio of about 2% and subjected to an ultraviolet ray treatment according to the method described in WO2014/109199, followed by drying with a spray dryer. Fibrillated powdery matter (hereinafter as "fibrillated LCP powder") was obtained in this manner.

This fibrillated LCP was added to butanediol (viscosity: about 90 mPa·s) at a weight ratio of about 8% to obtain a dispersion liquid. Meanwhile, the LCP powder obtained by freezing and crushing that was sieved through a 40-μm mesh was extracted, followed by an ultraviolet ray treatment also according to the method described in WO2014/109199. The intermediate product was added to the dispersion liquid at a weight ratio of about 8% and was agitated to obtain pasty matter. The obtained pasty matter had a viscosity of about 10000 mPa·s. This pasty matter was allowed to stand for 1 day, with no sedimentation of solid content observed.

An LCP base material having a thickness of about 18 μm with an approximately 18-μm-thick copper foil disposed on one surface and an approximately 25-μm-thick PET layer provided on the other surface was prepared. The pasty matter was applied onto the surface of the LCP base material with the copper foil disposed thereon by screen printing to form a coating. At the formation, the copper foil was covered with the coating. Subsequently, the stack was placed on a hot plate and dried at about 130° C. for about 3 minutes. An LCP base material sheet with a coating including a mixture of fibrillated LCP powder and non-fibrillated LCP powder and having a thickness of about 30 μm was obtained.

The surface of the stack with the coating formed thereon was irradiated with light at a pulse width of about 3 milliseconds and an output of about 390 V using Pulse-Forge1300 from NovaCentrix that is a flash lamp apparatus. An amount of irradiation was about 6 J/cm$^2$.

Peeling strength was measured to evaluate the adhesion of a portion of the coating to the base material in the stack after the irradiation. In this case, peeling strength is synonymous with adhesion strength. SAICAS®DN from Daipla Wintes Co., LTD was used in the measurement. Peeling strength was measured in a constant speed mode using a blade from Borazon which has a width of about 1 mm, a rake angle of about 20°, and a clearance angle of about 10° as a cutting blade. The resultant peeling strength was about 0.12 N/mm.

An approximately 18-μm-thick LCP base material was used as a thermoplastic resin layer, and LCP was used as a thermoplastic resin raw material. In other words, the primary material of the thermoplastic resin layer was identical to the primary material of the thermoplastic resin raw material.

In the present preferred embodiment, peeling strength was less than or equal to about 0.02 N/mm before irradiation with a flash lamp. It was confirmed that peeling strength has actually been increased by performing steps S1 to S3 in the present preferred embodiment.

Experiment

Samples 1 to 6 were further produced on several conditions, and the adhesion performance of each sample was measured. Table 1 shows the results of the measurements. Irradiation with a flash lamp was performed for samples 1 to 5, whereas irradiation with a flash lamp was not performed for sample 6. The light pulse width by flash lamp was about 3 milliseconds for samples 1 to 5.

TABLE 1

| | LCP mix ratio in dispersion liquid | | | Adhesion performance | |
|---|---|---|---|---|---|
| | Fibrillated | Non-fibrillated | Amount of irradiation | | |
| | LCP powder wt % | LCP powder wt % | with flash lamp J/cm² | Peel strength N | Dispersion |
| Sample 1 | 50 | 50 | 6 | 0.07 | A |
| Sample 2 | 50 | 50 | 7.6 | 0.25 | A |
| Sample 3 | 10 | 90 | 7.6 | 0.27 | A |
| Sample 4 | 0 | 100 | 7.6 | 0.05 | B |
| Sample 5 | 50 | 50 | 4 | less than 0.02 | C |
| Sample 6 | 50 | 50 | not irradiated | less than 0.02 | C |

A, B, C in the column "Dispersion" mean that A was very good, B was good, and C was poor. This experiment confirmed that irradiation with a flash lamp increases peeling strength and improves powder dispersion. Peeling strength is preferably about 0.05 N or more, and more preferably about 0.07 N or more, for example. Considering the above, sample 1 yielded a very good result.

Although light irradiation with a flash lamp was performed more or less for sample 5, due to a small amount of irradiation, LCP powder defining a thermoplastic resin raw material was not fused to an LCP base material. For samples 1 to 4 in which a thermoplastic resin raw material has been sufficiently fused to an LCP base material by irradiation with a flash lamp, dispersion of powder was successfully prevented or reduced, which yielded good results.

The pulse width is preferably 1 millisecond or more and 10 milliseconds or less, for example. With a pulse width less than about 1 millisecond, LCP powder is more likely to be burned due to energy concentration on the front surface. With a pulse width more than about 10 milliseconds, LCP powder is less likely to fuse, and an increased amount of irradiation is required for fusing.

Preferred Embodiment 3

With reference to FIGS. 10 to 23, a method of manufacturing a resin multilayer substrate according to Preferred Embodiment 3 of the present invention will be described. FIG. 10 shows a flowchart of the method of manufacturing a resin multilayer substrate according to the present preferred embodiment.

The method of manufacturing a resin multilayer substrate according to the present preferred embodiment includes a step S11 of preparing a resin layer composite including a resin sheet, a thermoplastic resin layer supported on one surface of the resin sheet, and a conductive pattern disposed on a surface of the thermoplastic resin layer opposite to the resin sheet, a step S12 of applying a dispersion liquid including a powdery thermoplastic resin raw material onto the surface of the thermoplastic resin layer opposite to the resin sheet so as to cover the conductive pattern, a step S13 of fusing the thermoplastic resin raw material to the thermoplastic resin layer by irradiating, with light from a flash lamp, a coating of the thermoplastic resin raw material formed in the applying step S12, a step S14 of removing the resin sheet from the resin layer composite after the fusing step, a step S15 of stacking another resin layer on a surface of the resin layer composite subjected to the step of removing the resin sheet, the surface being located at a side at which the thermoplastic resin raw material is diffused, and a step S16 of integrating a stack including the resin layer composite and the other resin layer by applying heat and pressure to the stack. The thermoplastic resin raw material preferably has a melting point higher than the glass transition point of a resin that is a primary material of the resin sheet.

Figure 12:
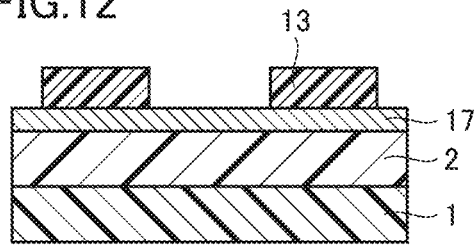
FIG. 12 illustrates a second step of the method of manufacturing a resin multilayer substrate in Preferred Embodiment 3 according to the present invention.
Figure 13:
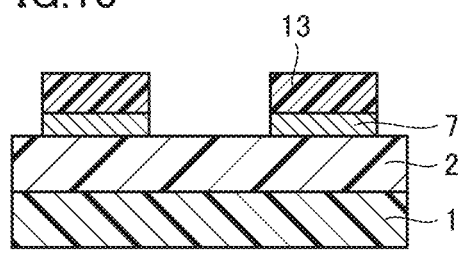
FIG. 13 illustrates a third step of the method of manufacturing a resin multilayer substrate in Preferred Embodiment 3 according to the present invention.
Figure 14:
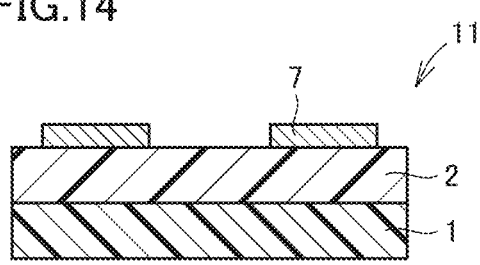
FIG. 14 illustrates a fourth step of the method of manufacturing a resin multilayer substrate according to Preferred Embodiment 3 of the present invention.

Each step of the method of manufacturing a resin multilayer substrate according to the present preferred embodiment will be described in more detail with reference to the figures Steps shown in FIGS. 11 to 14 are performed as step S11. First, as shown in FIG. 11, a stack of a resin sheet 1, a thermoplastic resin layer 2, and a conductor film 17 is prepared. In the present preferred embodiment, for example, the resin sheet is preferably a PET film, and thermoplastic resin layer 2 is preferably an LCP base material. Conductor film 17 is preferably formed of copper foil, for example. Conductor film 17 may preferably cover the entire or substantially the entire surface of thermoplastic resin layer 2. As shown in FIG. 12, a resist pattern 13 is formed so as to partially cover conductor film 17. As shown in FIG. 13, etching is performed using resist pattern 13 as a mask, thus forming a conductive pattern 7. As a result of etching, conductive pattern 7 is formed in only the region covered with resist pattern 13. Subsequently, resist pattern 13 is removed. Thus, the structure shown in FIG. 14 is obtained. Up to this point corresponds to step S11. In other words, resin layer composite 11 including resin sheet 1, thermoplastic resin layer 2 supported on one surface of resin sheet 1, and conductive pattern 7 disposed on the surface of thermoplastic resin layer 2 opposite to resin sheet 1 has been prepared in the preceding steps.

Figure 15:
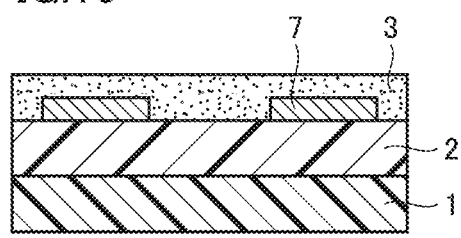
FIG. 15 illustrates a fifth step of the method of manufacturing a resin multilayer substrate according to Preferred Embodiment 3 of the present invention.

The structure shown in FIG. 15 is obtained by performing step S12. In other words, a dispersion liquid including powdery thermoplastic resin raw material 3 is applied onto the surface of thermoplastic resin layer 2 opposite to resin sheet 1 so as to cover conductive pattern 7. The coating obtained by applying the dispersion liquid of thermoplastic resin raw material 3 may preferably be dried.

Figure 16:
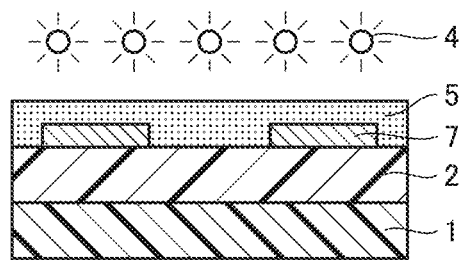
FIG. 16 illustrates a sixth step of the method of manufacturing a resin multilayer substrate according to Preferred Embodiment 3 of the present invention.

Step S13 is performed. In other words, as shown in FIG. 16, thermoplastic resin raw material 3 is fused to thermoplastic resin layer 2 by irradiating, with light from a flash lamp 4, the coating of thermoplastic resin raw material 3 formed in step S12. In FIG. 16, thermoplastic fused layer 5 has been obtained by fusion of the coating of thermoplastic resin raw material 3.

Figure 17:
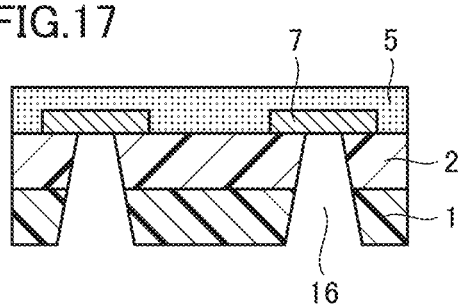
FIG. 17 illustrates a seventh step of the method of manufacturing a resin multilayer substrate according to Preferred Embodiment 3 of the present invention.
Figure 18:
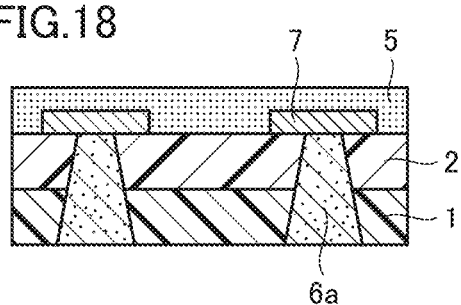
FIG. 18 illustrates an eighth step of the method of manufacturing a resin multilayer substrate according to Preferred Embodiment 3 of the present invention.

As shown in FIG. 17, via holes 16 passing through resin sheet 1 as well as thermoplastic resin layer 2 are formed. A known technique, such as, for example, irradiation with laser light, may preferably be used in the formation of via holes 16. As shown in FIG. 18, via holes 16 are filled with a conductive paste 6a. A portion of conductive paste 6a filling via holes 16 defines an interlayer connection conductor after layers are stacked. Since resin sheet 1 has been disposed when via holes 16 are filled with conductive paste 6a, thermoplastic resin layer 2 is sufficiently filled with conductive paste 6a.

Step S14 is performed. In other words, as shown in FIG. 19, resin sheet 1 is peeled off of thermoplastic resin layer 2 and removed. Step S14 is a step of removing resin sheet 1 from resin layer composite 11 after the fusing step S13. Since conductive paste 6a filling via holes 16 has yet to be cured at this step, conductive paste 6a within via holes 16 is severed along with peeling of resin sheet 1. The structure shown in FIG. 20 is obtained in this manner. Interlayer connection conductor 6 is disposed so as to pass through thermoplastic resin layer 2.

Although conductive paste 6a or interlayer connection conductor 6 that remains after resin sheet 1 has been peeled off is preferably disposed so as not to project from the surface of thermoplastic resin layer 2 in FIGS. 19 and 20, conductive paste 6a or interlayer connection conductor 6 may be disposed so as to project from the surface of thermoplastic resin layer 2. Such projection may stabilize interlayer connection with another resin layer.

Step S15 is performed. In other words, as shown in FIG. 21, another resin layer is stacked on the surface of the resin layer composite subjected to step S14 of removing a resin sheet, the surface being located at a side at which the thermoplastic resin raw material is fused. "Another resin layer" is a resin layer 2b in the example shown in FIG. 21 and is preferably an LCP base material that is identical or substantially identical to thermoplastic resin layer 2 in the present preferred embodiment. A sheet 103 including resin layer 2b is stacked on treated sheet 101 from above. Treated sheet 101 is stacked on a sheet 102 including a resin layer 2a. In the example shown in FIG. 21, a thermoplastic resin raw material is applied and fused to the upper surface of resin layer 2a in sheet 102 as in treated sheet 101. In this example, no interlayer connection conductor is disposed in resin layer 2a included in sheet 102.

Figure 22:
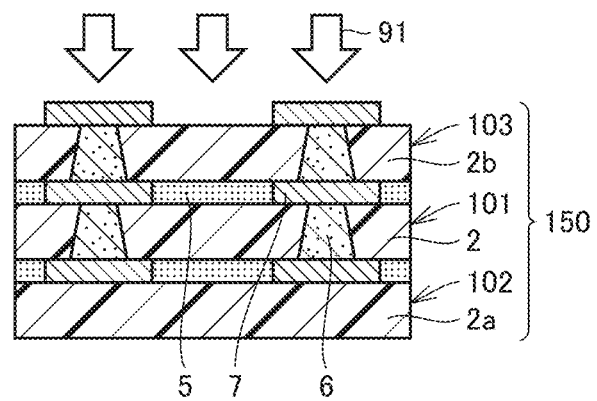
FIG. 22 illustrates a twelfth step of the method of manufacturing a resin multilayer substrate according to Preferred Embodiment 3 of the present invention.
Figure 23:
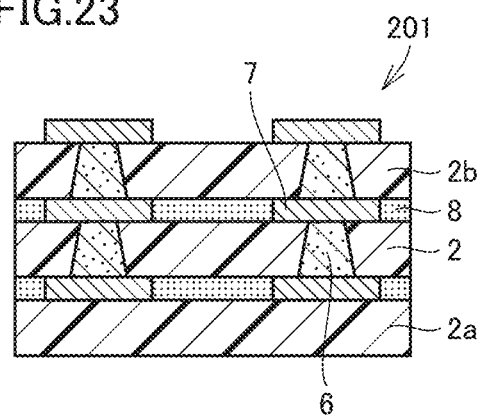
FIG. 23 is a sectional view of a resin multilayer substrate obtained by the method of manufacturing a resin multilayer substrate according to Preferred Embodiment 3 of the present invention.

Step S16 is performed. In other words, as shown in FIG. 22, a stack 150 including treated sheet 101 and the other resin layer 2b, which is a resin layer composite, is integrated by applying heat and pressure to the stack. Thermoplastic fused layer 5 is thus compressed. In the region including conductive pattern 7, as a result of the application of heat and pressure, thermoplastic fused layer 5 is pushed away by conductive pattern 7. In the region including no conductive pattern 7, thermoplastic fused layer 5 is compressed to about the thickness of conductive pattern 7. In this manner, a resin multilayer substrate 201 is able to be obtained as shown in FIG. 23. At the completion of step S16, thermoplastic fused layer 5 shown in FIG. 22 has turned into thermoplastic resin raw material layer 8 as shown in FIG. 23.

In the method of manufacturing a resin multilayer substrate according to the present preferred embodiment, thermoplastic resin raw material 3 is fused to thermoplastic resin layer 2 by irradiation of light from flash lamp 4, thus compensating for the thickness of the entire stack without dispersion of powdery matter.

The primary material used for thermoplastic resin raw material 3 is preferably identical or substantially identical to the primary material used for thermoplastic resin layer 2 in the method of manufacturing a resin multilayer substrate in the present preferred embodiment. This is because the use of the same primary material enables the thermoplastic resin raw material to securely bond to thermoplastic resin layer when the former is fused to the latter.

In the method of manufacturing a resin multilayer substrate according to the present preferred embodiment, the primary material used for thermoplastic resin raw material 3 is preferably a liquid crystal polymer resin, for example. This is because in this case, a powdery thermoplastic resin raw material is able to be easily obtained by crushing the sheet of the liquid crystal polymer.

In the method of manufacturing a resin multilayer substrate according to the present preferred embodiment, powdery thermoplastic resin raw material 3 is preferably a fibrillated powder, for example. This is because in this case, the surface area of powder is able to be increased for excellent fusion.

Comparative Experiment

In actuality, in an LCP base material in which a copper foil defining a conductor film adheres to one surface thereof, a coating of a thermoplastic resin raw material was formed on a surface of the LCP base material opposite to the surface with the copper foil, and the coating was irradiated with light from a flash lamp to be fused. In addition, an interconnect defining a conductive pattern was formed in the copper foil by a subtractive process. The conductive pattern was formed as a banded pattern in which lines having the same or substantially the same width are repeated regularly. Six such sheets were created. These six sheets were stacked, and compressed and heated to produce an artificial multilayer circuit board. For compression and heating, a vacuum press apparatus was used at about 280° C. The resultant product is referred to as an artificial multilayer circuit board A.

For comparison, an LCP base material with no coating of a thermoplastic resin raw material formed thereon was used to form an interconnect defining a conductive pattern similarly to the above, and six such sheets were stacked, and heated and compressed under the same condition as the above condition to produce an artificial multilayer circuit board. The resultant product is referred to as an artificial multilayer circuit board B.

In artificial multilayer circuit board B, due to the stack of conductive patterns at the same location, a resin flows in the vicinity of this location, so that the conductive patterns were displaced or deformed by the resin flow. However, in artificial multilayer circuit board A, the conductive patterns were buried in the layer of the fused thermoplastic resin raw material, and thus, hardly any resin flow has occurred. Thus, the conductive patterns were not displaced or deformed. In other words, it was revealed that a better result is obtained with artificial multilayer circuit board A than with artificial multilayer circuit board B. It can be said from the above that a good result was achieved by forming a coating of a thermoplastic resin raw material and irradiating the coating with light from a flash lamp to fuse the coating in the production of artificial multilayer circuit board A, in terms of prevention of displacement or deformation of conductive patterns resulting from a resin flow.

Among the preferred embodiments of the present invention described above, a plurality of preferred embodiments may be provided and used in an appropriate combination.

The preferred embodiments of the present invention disclosed above are illustrative and non-restrictive in every respect. The scope of the present invention is defined by the terms of the claims, rather than the description above, and is intended to include any modifications within the meaning and scope equivalent to the terms of the claims.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A method of manufacturing a resin multilayer substrate, the method comprising:
   preparing a resin layer composite including a resin sheet, a thermoplastic resin layer supported on one surface of the resin sheet, and a conductive pattern disposed on a surface of the thermoplastic resin layer opposite to the resin sheet;
   applying a dispersion liquid including a powdery thermoplastic resin raw material onto a surface of the thermoplastic resin layer opposite to the resin sheet so as to cover the conductive pattern;
   fusing the thermoplastic resin raw material to the thermoplastic resin layer by irradiating, with light from a flash lamp, a coating of the thermoplastic resin raw material formed in the applying step;
   removing the resin sheet from the resin layer composite after the fusing step;
   stacking another resin layer on a surface of the resin layer composite subjected to the step of removing the resin sheet, the surface being located at a side at which the thermoplastic resin raw material is fused; and
   integrating a stack including the resin layer composite and the other resin layer by applying heat and pressure to the stack; wherein
   the thermoplastic resin raw material has a melting point higher than a glass transition point of a resin that is a primary material of the resin sheet; and
   a portion of the dispersion liquid including the powdery thermoplastic resin raw material that covers the conductive pattern is irradiated with light from the flash lamp in the step of fusing the thermoplastic resin raw material to the thermoplastic resin layer.

2. The method according to claim 1, wherein a primary material of the thermoplastic resin raw material is identical or substantially identical to a primary material of the thermoplastic resin layer.

3. The method according to claim 1, wherein a primary material of the thermoplastic resin raw material includes a liquid crystal polymer.

4. The method according to claim 3, wherein the powdery thermoplastic resin raw material includes a fibrillated powder.

5. The method according to claim 1, wherein the resin that is the primary material of the resin sheet layer is polyethylene terephthalate.

6. The method according to claim 1, wherein the light from the flash lamp is a pulsed light.

7. The method according to claim 1, wherein a light pulse width of the flash lamp during irradiation is about 3 milliseconds.

8. The method according to claim 1, wherein the conductive pattern is formed of a copper foil.

9. The method according to claim 1, wherein a primary material of the another resin layer includes a liquid crystal polymer.

10. A method of manufacturing a resin multilayer substrate, the method comprising:
    preparing a resin layer composite including a resin sheet, a thermoplastic resin layer supported on one surface of the resin sheet, and a conductive pattern disposed on a surface of the thermoplastic resin layer opposite to the resin sheet;
    applying a dispersion liquid including a powdery thermoplastic resin raw material onto a surface of the thermoplastic resin layer opposite to the resin sheet so as to cover the conductive pattern;
    fusing the thermoplastic resin raw material to the thermoplastic resin layer by irradiating, with light from a flash lamp, a coating of the thermoplastic resin raw material formed in the applying step;
    removing the resin sheet from the resin layer composite after the fusing step;
    stacking another resin layer on a surface of the resin layer composite subjected to the step of removing the resin sheet, the surface being located at a side at which the thermoplastic resin raw material is fused; and
    integrating a stack including the resin layer composite and the other resin layer by applying heat and pressure to the stack; wherein
    the thermoplastic resin raw material has a melting point higher than a glass transition point of a resin that is a primary material of the resin sheet; and
    the thermoplastic resin raw material covers the conductive pattern after the fusing step.

* * * * *